United States Patent
Shin et al.

(10) Patent No.: US 9,812,526 B2
(45) Date of Patent: Nov. 7, 2017

(54) THREE-DIMENSIONAL SEMICONDUCTOR DEVICES

(71) Applicant: SAMSUNG ELECTRONICS CO., LTD., Suwon-si, Gyeonggi-Do (KR)

(72) Inventors: Kyung-Jun Shin, Seoul (KR); Byoungil Lee, Seoul (KR); Dongseog Eun, Seongnam-si (KR); Hyunkook Lee, Suwon-si (KR); Seong Soon Cho, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/260,135

(22) Filed: Sep. 8, 2016

(65) Prior Publication Data

US 2017/0110543 A1    Apr. 20, 2017

(30) Foreign Application Priority Data

Oct. 19, 2015   (KR) .................. 10-2015-0145647

(51) Int. Cl.
*H01L 29/49*    (2006.01)
*H01L 29/10*    (2006.01)
*H01L 27/1157*   (2017.01)
*H01L 27/11582*  (2017.01)

(52) U.S. Cl.
CPC ...... *H01L 29/1083* (2013.01); *H01L 27/1157* (2013.01); *H01L 27/11582* (2013.01)

(58) Field of Classification Search
CPC ............ H01L 29/1083; H01L 27/1157; H01L 27/11582
See application file for complete search history.

(56) References Cited

U.S. PATENT DOCUMENTS

| | | |
|---|---|---|
| 6,809,005 B2 | 10/2004 | Ranade et al. |
| 7,524,739 B2 | 4/2009 | Lin |
| 7,679,133 B2 | 3/2010 | Son et al. |
| 8,553,466 B2 | 10/2013 | Han et al. |
| 8,559,235 B2 | 10/2013 | Yoon et al. |
| 8,643,080 B2 | 2/2014 | Lee et al. |
| 8,654,587 B2 | 2/2014 | Yoon et al. |
| 8,743,614 B2 | 6/2014 | Shim et al. |
| 9,012,974 B2 | 4/2015 | Chae et al. |
| 9,076,879 B2 | 7/2015 | Yoo et al. |
| 9,130,054 B2 | 9/2015 | Jang et al. |
| 2008/0149969 A1* | 6/2008 | Suzuki ............ H01L 21/823807 257/255 |
| 2011/0233648 A1 | 9/2011 | Seol et al. |
| 2012/0018806 A1* | 1/2012 | Furukawa ............... H01L 21/84 257/347 |
| 2012/0068255 A1* | 3/2012 | Lee .................. H01L 27/11582 257/324 |

(Continued)

FOREIGN PATENT DOCUMENTS

JP   2008-171836   7/2008

*Primary Examiner* — Michael Shingleton

(74) *Attorney, Agent, or Firm* — F. Chau & Associates, LLC

(57) ABSTRACT

A three-dimensional (3D) semiconductor device includes a plurality of gate electrodes stacked on a substrate in a direction normal to a top surface of the substrate, a channel structure passing through the gate electrodes and connected to the substrate, and a void disposed in the substrate and positioned below the channel structure.

20 Claims, 15 Drawing Sheets

(56) References Cited

U.S. PATENT DOCUMENTS

| | | |
|---|---|---|
| 2013/0334593 A1 | 12/2013 | Seol et al. |
| 2015/0055413 A1* | 2/2015 | Alsmeier ........... G11C 14/0018 |
| | | 365/185.08 |
| 2015/0060976 A1 | 3/2015 | Iguchi |
| 2015/0060977 A1 | 3/2015 | Lee et al. |
| 2015/0115348 A1 | 4/2015 | Nam et al. |
| 2015/0145020 A1 | 5/2015 | Kim et al. |
| 2016/0181264 A1* | 6/2016 | Miyamoto ........ H01L 27/11524 |
| | | 257/314 |
| 2016/0218190 A1* | 7/2016 | Fukuoka ............. H01L 29/4236 |
| 2017/0110543 A1* | 4/2017 | Shin ................... H01L 27/1157 |

* cited by examiner

THREE-DIMENSIONAL SEMICONDUCTOR DEVICES

CROSS-REFERENCE TO RELATED APPLICATIONS

This application claims priority under 35 U.S.C. §119 to Korean Patent Application No. 10-2015-0145647, filed on Oct. 19, 2015, the disclosure of which is hereby incorporated by reference in its entirety.

TECHNICAL FIELD

The present disclosure relates to a semiconductor device, and more particularly, to a three-dimensional (3D) semiconductor memory device including three-dimensionally arranged memory cells.

DISCUSSION OF THE RELATED ART

Higher integration of semiconductor devices is being implemented to satisfy consumer demand for superior performance and inexpensive prices. In the case of semiconductor devices, since their integration is an important factor in determining product prices, increased integration is desired. In the case of typical two-dimensional or planar semiconductor memory devices, since their integration is primarily determined by the area occupied by a unit memory cell, integration is greatly influenced by the level of a fine pattern forming technology. However, the expensive process equipment needed to increase pattern fineness sets a practical limitation on increasing integration for two-dimensional or planar semiconductor devices.

To overcome such a limitation, three-dimensional semiconductor devices including three-dimensionally-arranged memory cells have been proposed.

SUMMARY

Exemplary embodiments of the inventive concept provide three-dimensional semiconductor devices with improved electrical characteristics.

Exemplary embodiments of the inventive concept provide highly reliable three-dimensional semiconductor devices.

According to exemplary embodiments of the inventive concept, a three-dimensional semiconductor device includes a plurality of gate electrodes stacked on a substrate in a direction normal to a top surface of the substrate, a channel structure passing through the gate electrodes and connected to the substrate, and a void disposed in the substrate and positioned below the channel structure.

According to exemplary embodiments of the inventive concept, a three-dimensional semiconductor device includes a plurality of gate electrodes stacked on a substrate in a first direction normal to a top surface of the substrate, a channel structure disposed in a through hole, in which the through hole passes through the gate electrodes and at least a portion of the substrate, and in which the channel structure extends in the first direction, and a void disposed in the through hole and positioned below the channel structure. The channel structure includes a lower semiconductor pattern in contact with the substrate, and the lower semiconductor pattern includes a bottom surface forming a portion of an inner surface of the void.

According to exemplary embodiments of the inventive concept, a three-dimensional (3D) semiconductor device includes a lower gate electrode disposed on a substrate, a plurality of upper gate electrodes disposed on the substrate, in which the lower gate electrode and the upper gate electrodes are sequentially stacked on the substrate in a direction normal to a top surface of the substrate, a through hole penetrating the lower gate electrode, the upper gate electrodes, and a portion of the substrate, a lower semiconductor pattern disposed in a lower region of the through hole and partially disposed within substrate, a residue layer including at least one of carbon and oxygen disposed in the lower region of the through hole below the lower semiconductor pattern, and a void disposed in the lower region of the through hole between the residue layer and the lower semiconductor pattern, in which an upper boundary of the void is defined by a bottom surface of the lower semiconductor pattern, and a lower boundary of the void is defined by an upper surface of the residue layer.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
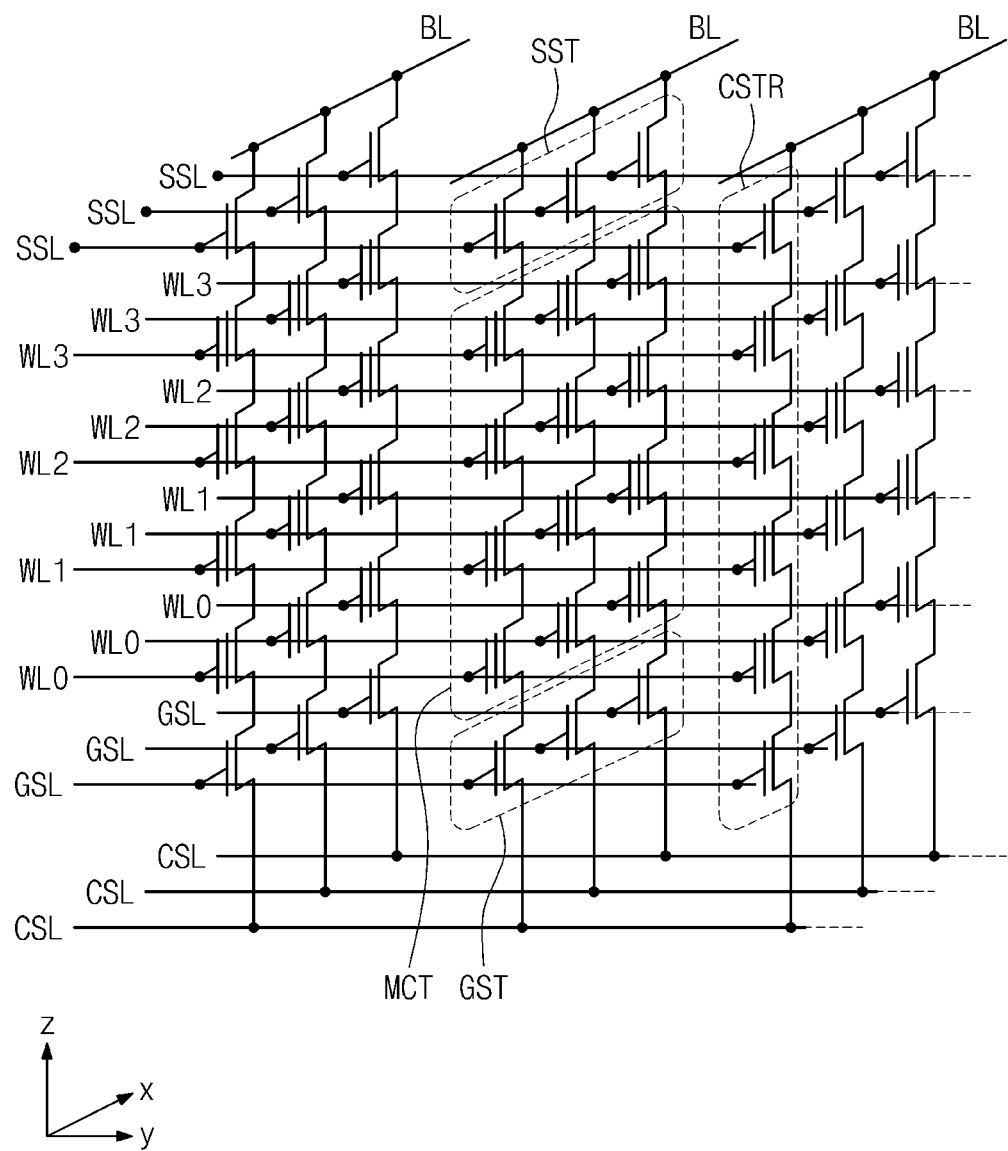
FIG. 1 is a circuit diagram schematically illustrating a cell array of a three-dimensional semiconductor memory device according to an exemplary embodiment of the inventive concept.

Exemplary embodiments of the inventive concept will be described more fully hereinafter with reference to the accompanying drawings. FIG. 1 is a circuit diagram schematically illustrating a cell array of a three-dimensional (3D) semiconductor memory device according to an exemplary embodiment of the inventive concept.

Referring to FIG. 1, a cell array of a three-dimensional semiconductor memory device in an exemplary embodiment includes a common source line CSL, a plurality of bit lines BL, and a plurality of cell strings CSTR disposed between the common source line CSL and the bit lines BL.

The common source line CSL may be a conductive pattern disposed on a substrate, or an impurity region formed in the substrate. The bit lines BL may be conductive patterns (e.g., metal lines) that are vertically spaced apart from the substrate. The bit lines BL may be two-dimensionally arranged, and a plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In exemplary embodiments, a plurality of common source lines CSL may be provided and be two-dimensionally arranged on the substrate, as shown in FIG. 1. In exemplary embodiments, the common source lines CSL may be applied with the same voltage. In exemplary embodiments, the common source lines CSL may be separated from each other and thereby may be independently controlled.

Each of the cell strings CSTR may include a ground selection transistor GST coupled to the common source line CSL, a string selection transistor SST coupled to the corresponding bit line BL, and a plurality of memory cell transistors MCT disposed between the ground and string selection transistors GST and SST. The ground selection transistor GST, the string selection transistor SST, and the memory cell transistors MCT may be connected in series.

The common source line CSL may be connected in common to source regions of the ground selection transistors GST. At least one ground selection line GSL, a plurality of word lines WL0-WL3, and a plurality of string selection lines SSL may be disposed between the common source line CSL and the bit lines BL, and may serve as gate electrodes of the ground selection transistor GST, the memory cell transistors MCT, and the string selection transistors SST, respectively. In addition, each of the memory cell transistors MCT may include a data storage element.

Figure 2:
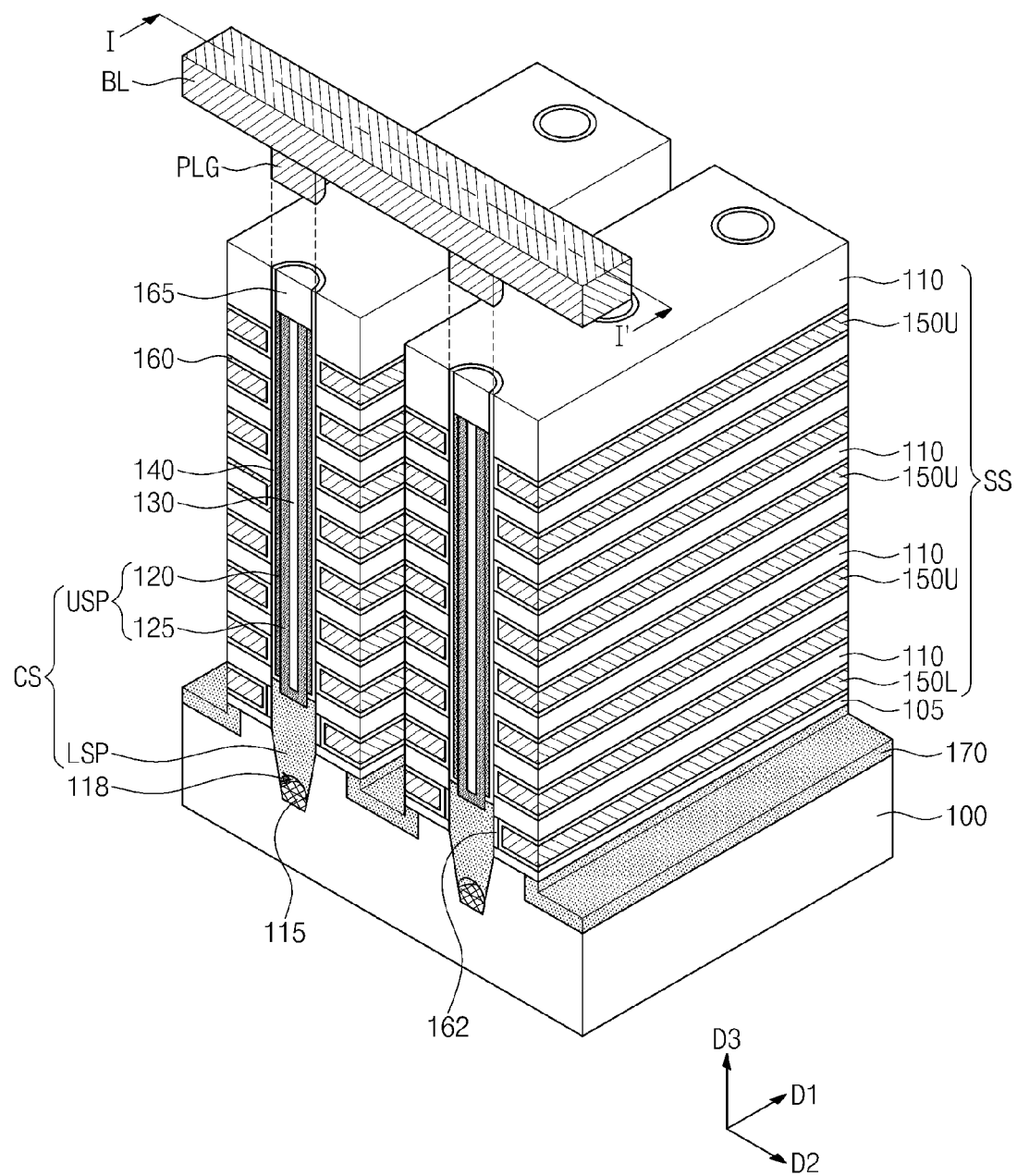
FIG. 2 is a perspective view illustrating a three-dimensional semiconductor memory device according to an exemplary embodiment of the inventive concept.
Figure 3:
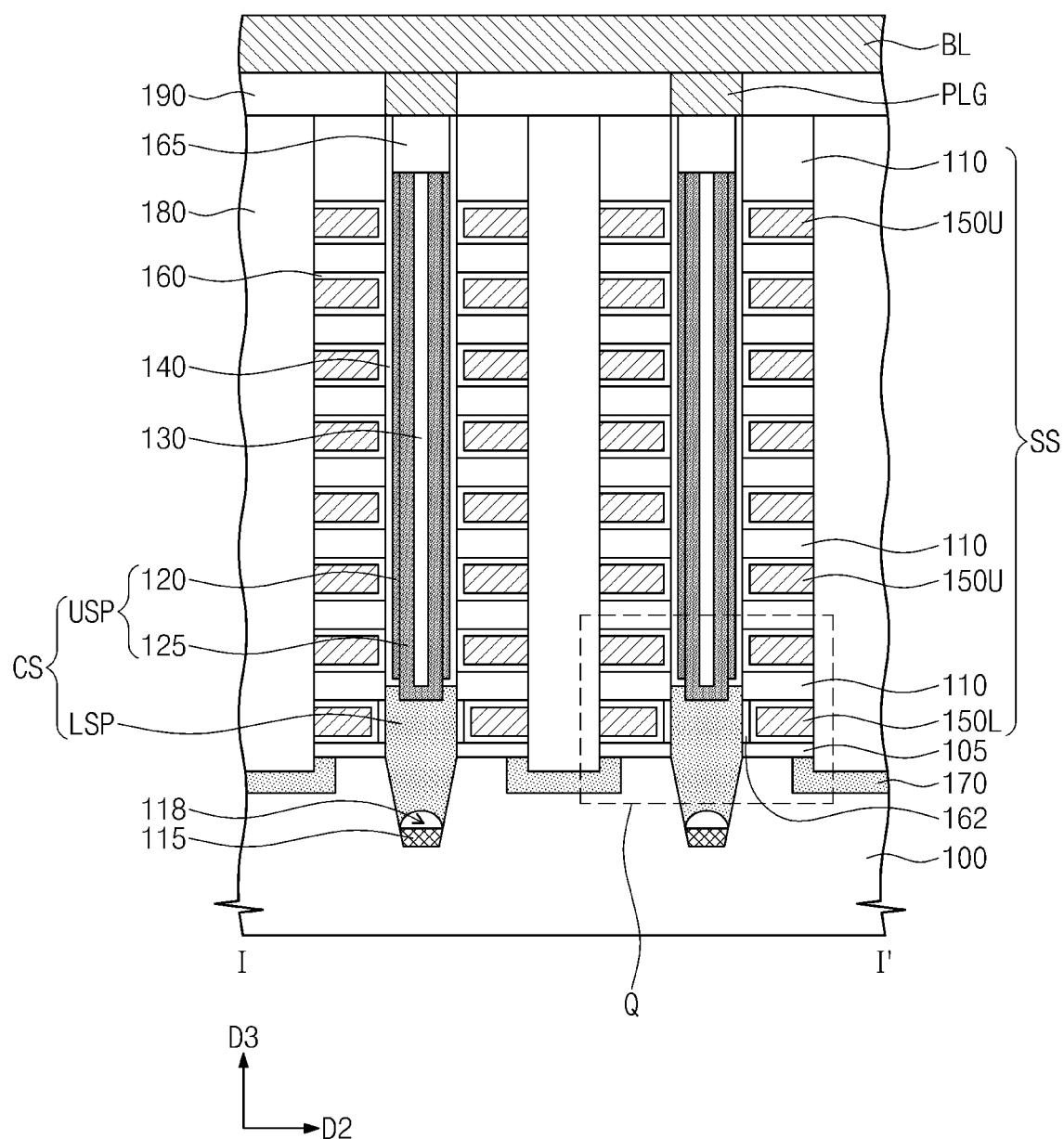
FIG. 3 is a cross-sectional view taken along line I-I' of FIG. 2 according to an exemplary embodiment of the inventive concept.
Figure 4:
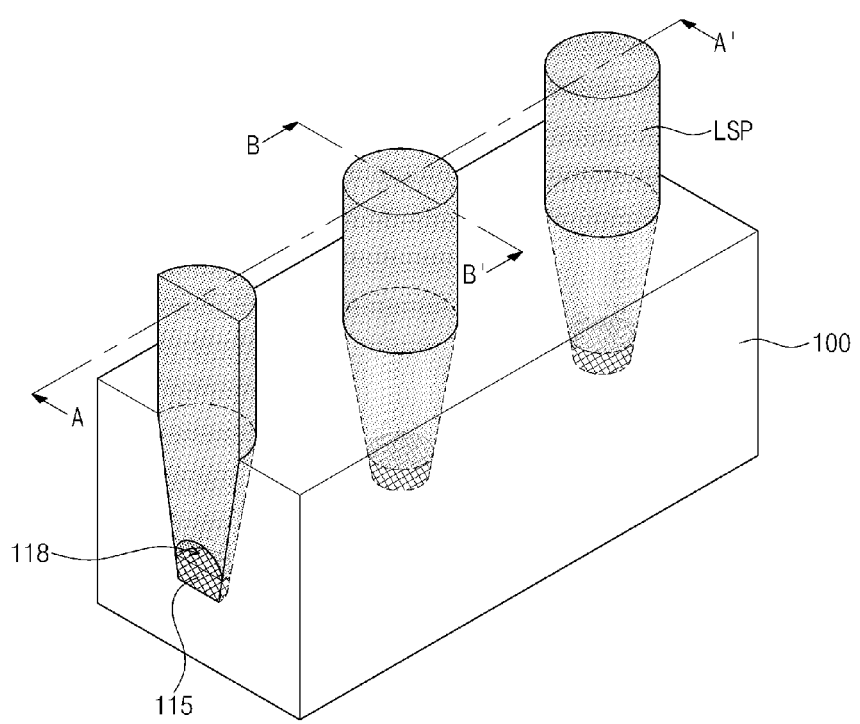
FIG. 4 is a diagram schematically illustrating a lower semiconductor pattern and a void disposed below the lower semiconductor pattern, according to an exemplary embodiment of the inventive concept.
Figure 5A:
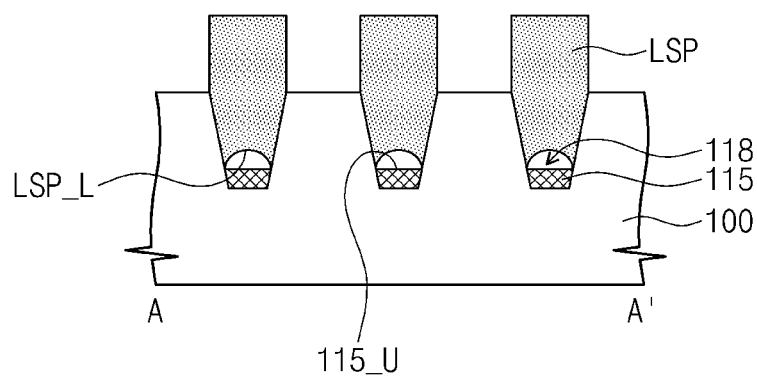
FIGS. 5A and 5B are cross-sectional views taken along lines A-A' and B-B', respectively, of FIG. 4, according to exemplary embodiments of the inventive concept.
Figure 5B:
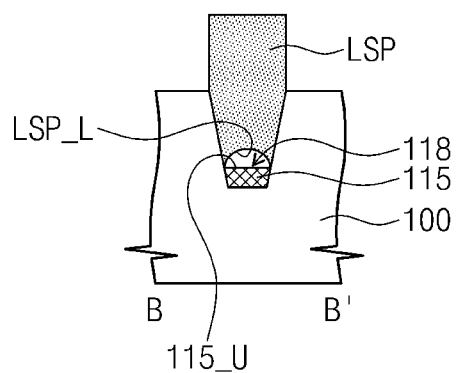
Figure 6:
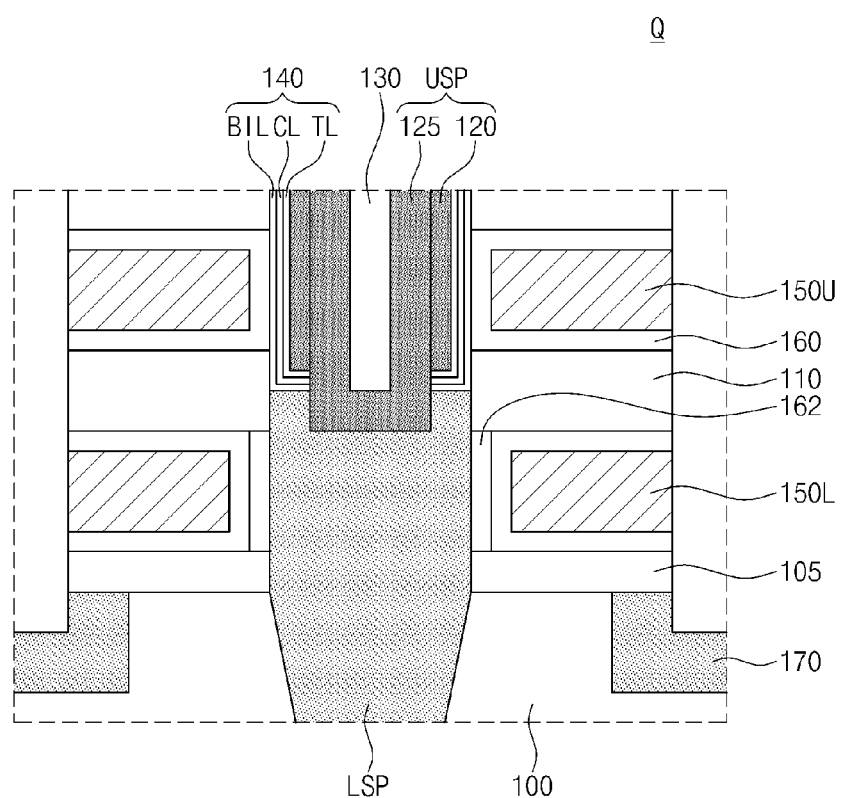
FIG. 6 is an enlarged view of a portion 'Q' of FIG. 3 according to an exemplary embodiment of the inventive concept.

FIG. 2 is a perspective view illustrating a three-dimensional semiconductor memory device according to an exemplary embodiment of the inventive concept. FIG. 3 is a cross-sectional view taken along line I-I' of FIG. 2 according to an exemplary embodiment of the inventive concept. FIG. 4 is a diagram schematically illustrating a lower semiconductor pattern and a void disposed below the lower semiconductor pattern according to an exemplary embodiment of the inventive concept. FIGS. 5A and 5B are cross-sectional views taken along lines A-A' and B-B', respectively, of FIG. 4, according to exemplary embodiments of the inventive concept. FIG. 6 is an enlarged view of a portion 'Q' of FIG. 3 according to an exemplary embodiment of the inventive concept.

Referring to FIGS. 2 and 3, in an exemplary embodiment, a three-dimensional semiconductor memory device includes a stack SS including insulating layers 110 and gate electrodes, which are alternately and repeatedly stacked on a substrate 100. The substrate 100 may be, for example, a silicon (Si) wafer, a germanium (Ge) wafer, or a silicon-germanium (SiGe) wafer. The gate electrodes may include a lower gate electrode 150L on the substrate 100 and upper gate electrodes 150U stacked on the lower gate electrode 150L.

When viewed in a plan view, the stack SS may be, for example, a line-shaped structure extending parallel to a first direction D1. The gate electrodes 150L and 150U may be stacked in a third direction D3 that is orthogonal to both of the first direction D1 and a second direction D2 crossing the first direction D1. The first direction D1 and the second direction D2 may be substantially parallel to a top surface of the substrate 100, and the third direction D3 may be substantially perpendicular to the top surface of the substrate 100. The gate electrodes 150L and 150U may be spaced apart from each other, in the third direction D3, by the insulating layers 110 provided between the gate electrodes 150L and 150U. The insulating layers 110 may be formed of or include, for example, at least one of a silicon layer, a silicon oxide layer, a silicon carbide layer, a silicon oxynitride layer, or a silicon nitride layer. The gate electrodes 150L and 150U may be formed of or include at least one of, for example, crystalline silicon, polycrystalline silicon, metals, or conductive metal nitrides.

A lower insulating layer 105 may be provided between the substrate 100 and the stack SS. The lower insulating layer 105 may be formed of or include at least one of, for example, a silicon oxide layer, a silicon nitride layer, or high-k dielectric layers (e.g., of aluminum oxide and hafnium oxide). In an exemplary embodiment, the lower insulating layer 105 is thinner than the insulating layers 110.

The substrate 100 may include common source regions 170 doped with impurities. The common source regions 170 may be provided in the substrate 100 and at both sides of the stack SS. When viewed in a plan view, the common source regions 170 may be line-shaped structures extending in the first direction D1, and may be spaced apart from one another in the second direction D2.

In an exemplary embodiment, a channel structure CS passes through the stack SS and is electrically connected to the substrate 100. In exemplary embodiments, when viewed in a plan view, a plurality of the channel structures CS are provided in the stack SS and are arranged in the first direction D1. In exemplary embodiments, when viewed in a plan view, the plurality of the channel structures CS are arranged in a zigzag pattern in the first direction D1.

The channel structure CS may include a lower semiconductor pattern LSP and an upper semiconductor pattern USP. In an exemplary embodiment, the lower semiconductor pattern LSP passes through a lower portion of the stack SS and a portion of the substrate 100, and is connected to the substrate 100. In an exemplary embodiment, the upper semiconductor pattern USP passes through an upper portion of the stack SS and is connected to the lower semiconductor pattern LSP. In an exemplary embodiment, the lower semiconductor pattern LSP is partially disposed within the substrate 100, and the upper semiconductor pattern USP is spaced apart from the substrate 100. The lower semiconductor pattern LSP is disposed between the upper semiconductor pattern USP and the substrate 100. A void 118 is disposed between the lower semiconductor pattern LSP and a residue layer 115. According to exemplary embodiments, the void 118 is an empty space that does not include a semiconductor material(s) used during the manufacture of the 3D semiconductor memory device.

The upper semiconductor pattern USP may be shaped like, for example, a hollow pipe. The upper semiconductor pattern USP may have a closed bottom portion. An inner space of the upper semiconductor pattern USP may be filled with an insulating gapfill pattern 130. The upper semiconductor pattern USP may have a bottom surface that is located at a lower level than a top surface of the lower semiconductor pattern LSP. For example, the upper semiconductor pattern USP may have a bottom portion that is inserted into the lower semiconductor pattern LSP.

The upper semiconductor pattern USP may include a first semiconductor pattern 120 and a second semiconductor pattern 125. The first semiconductor pattern 120 may cover an inner side surface of the stack SS. The first semiconductor pattern 120 may be a pipe-shaped structure with an open top and bottom. The first semiconductor pattern 120 may be spaced apart from the lower semiconductor pattern LSP. That is, the first semiconductor pattern 120 and the lower semiconductor pattern LSP do not contact each other. The second semiconductor pattern 125 may be a pipe-shaped structure with a closed bottom. An inner space of the second semiconductor pattern 125 may be filled with the insulating gapfill pattern 130. The second semiconductor pattern 125 may be in contact with an inner side surface of the first semiconductor pattern 120 and an upper portion of the lower semiconductor pattern LSP. The second semiconductor pattern 125 may have a bottom surface that is located at a lower level than the top surface of the lower semiconductor pattern LSP. For example, the second semiconductor pattern 125 may include a portion inserted into the lower semiconductor pattern LSP. Thus, the first semiconductor pattern 120 may be electrically connected to the lower semiconductor pattern LSP through the second semiconductor pattern 125.

The first and second semiconductor patterns 120 and 125 are formed of a semiconductor material. For example, the first and second semiconductor patterns 120 and 125 may be a doped or intrinsic semiconductor layer that is made of, for example, silicon (Si), germanium (Ge), or any mixture thereof. The first and second semiconductor patterns 120 and 125 may have, for example, a single-crystalline, amorphous, or polycrystalline crystal structure.

The lower semiconductor pattern LSP may be formed of a semiconductor material having a conductivity type that is the same as the substrate 100. In exemplary embodiments, the lower semiconductor pattern LSP may be a semiconductor epitaxial pattern that is epitaxially grown using the substrate 100 as a seed layer. In this case, at least a portion of the lower semiconductor pattern LSP may have a single-crystalline or poly-crystalline structure. The lower semiconductor pattern LSP may be in contact with an inner surface of the substrate 100. The lower semiconductor pattern LSP may be, for example, a pillar-shaped structure that is inserted into a top portion of the substrate 100.

The residue layer 115 may be provided in the substrate 100 and may be disposed below the channel structure CS. The residue layer 115 may contain at least one of, for example, carbon and oxygen. In exemplary embodiments, the void 118 is formed between the channel structure CS and the residue layer 115.

In an exemplary embodiment in which a plurality of the channel structures CS are provided in each of the stacks SS, the plurality of the channel structures CS may be horizontally spaced apart from each other on the substrate 100. Further, a plurality of the residue layers 115 may be provided in the substrate 100, and may be horizontally spaced apart from one another. Each of the residue layers 115 may be locally formed below a corresponding one of the channel structures CS. As an example, the residue layers 115 may be localized below the channel structures CS, respectively. Similarly, a plurality of the voids 118 may be formed in the substrate 100, and may be horizontally spaced apart from one another. Each of the voids 118 may be interposed between a corresponding pair of the channel structures CS and the residue layers 115. As an example, each of the voids 118 may be interposed between a corresponding one of the channel structures CS and a corresponding one of the residue layers 115.

As shown in FIGS. 2 and 3, in an exemplary embodiment, the gate electrodes (e.g., gate electrodes 150L and 150U) are stacked on the substrate 100 in a direction normal to a top surface of the substrate 100. The channel structure CS passes through the gate electrodes and is connected (e.g., electrically connected) to the substrate 100. The void 118 is disposed in the substrate 100 and positioned below the channel structure CS. Further, in an exemplary embodiment, a 3D semiconductor device includes a plurality of channel structures CS and a plurality of voids 118. The channel structures CS are spaced apart from one another in a direction substantially parallel to the top surface of the substrate 100, the voids 118 are spaced apart from one another in the direction substantially parallel to the top surface of the substrate 100, and each of the voids 118 is positioned below a corresponding one of the channel structures CS, as shown in FIGS. 2 and 3.

As shown in FIGS. 4, 5A, and 5B, in an exemplary embodiment, the residue layer 115 is locally provided in the substrate 100 below the lower semiconductor pattern LSP. The void 118 is formed between the lower semiconductor pattern LSP and the residue layer 115. The lower semiconductor pattern LSP has a bottom surface LSP_L that is lower than the top surface of the substrate 100 and that constitutes a portion of an inner surface of the void 118. In exemplary embodiments, the bottom surface LSP_L of the lower semiconductor pattern LSP has a curved shape. In exemplary embodiments, the residue layer 115 has a top surface 115_U constituting/forming the inner surface of the void 118 in conjunction with the bottom surface LSP_L of the lower semiconductor pattern LSP. The void 118 may be defined by the bottom surface LSP_L of the lower semiconductor pattern LSP and the top surface 115_U of the residue layer 115. That is, the void 118 may be an empty space having its boundaries defined by the lower semiconductor pattern LSP and the residue layer 115. In exemplary embodiments, the top surface 115_U of the residue layer 115 may be substantially flat (e.g., exactly flat or almost exactly flat within a measurement error).

In exemplary embodiments, a plurality of the lower semiconductor patterns lSP and a plurality of the residue layers 115 are provided in the substrate 100. The plurality of the lower semiconductor patterns LSP are horizontally spaced apart from one another, and the plurality of the residue layers 115 are also horizontally spaced apart from one another. Each of the residue layers 115 is locally formed below a corresponding one of the lower semiconductor patterns LSP. As an example, the residue layers 115 may be locally formed below the lower semiconductor patterns LSP, respectively. A plurality of the voids 118 are provided in the substrate 100 and are horizontally spaced apart from one another. Each of the voids 118 is interposed between a corresponding pair of the lower semiconductor patterns LSP and the residue layers 115. As an example, each of the voids 118 may be interposed between a corresponding one of the lower semiconductor patterns LSP and a corresponding one of the residue layers 115.

Referring back to FIGS. 2 and 3, in an exemplary embodiment, the stack SS includes the lower gate electrode 150L adjacent to the lower semiconductor pattern LSP, and the upper gate electrodes 150U adjacent to the upper semiconductor pattern USP. In exemplary embodiments, the lower gate electrode 150L serves as the gate electrode of the ground selection transistor GST described with reference to FIG. 1. For example, in 3D NAND flash memory devices, the lower gate electrode 150L may be used as the gate electrode of the ground selection transistor GST for controlling the electrical connection between the common source regions 170 and the lower semiconductor pattern LSP. Some of the upper gate electrodes 150U may serve as the gate electrodes of the memory cell transistors MCT described with reference to FIG. 1. The upper gate electrode 150U, which is located at the uppermost level of the stack SS, may serve as the gate electrode of the string selection transistor SST described with reference to FIG. 1. For example, in the 3D NAND flash memory devices, the upper gate electrode 150U may serve as the gate electrode of the string selection transistor SST for controlling the electric connection between the bit line BL and the channel structure CS.

At least one of the insulating layers 110 adjacent to the lower semiconductor pattern LSP may be in contact (e.g., direct contact) with a side surface of the lower semiconductor pattern LSP. For example, the lower semiconductor pattern LSP may be provided in such a way that a portion of the top surface thereof is located at a higher level than the top surface of the lower gate electrode 150L. A gate dielectric pattern 162 may be disposed between the lower semiconductor pattern LSP and the lower gate electrode 150L. The gate dielectric pattern 162 may include, for example, a silicon oxide layer. In exemplary embodiments, the gate dielectric pattern 162 is formed by oxidizing a portion of the lower semiconductor pattern LSP.

In an exemplary embodiment, a vertical insulator 140 is interposed between the stack SS and the upper semiconductor pattern USP. The vertical insulator 140 may be, for example, a pipe-shaped structure with an open top and bottom. A bottom surface of the vertical insulator 140 may be in contact (e.g., direct contact) with at least a portion of the top surface of the lower semiconductor pattern LSP.

Referring to FIG. 6, the vertical insulator 140 may include a memory element or a data storing element. For example, the vertical insulator 140 may include a charge storing layer CL of a flash memory device. Data stored in the vertical insulator 140 may be changed using, for example, a Fowler-Nordheim (FN) tunneling effect, which may be caused by a difference in voltage between the upper semiconductor pattern USP and the upper gate electrodes 150U. Alternatively, the vertical insulator 140 may include a layer exhibiting, for example, a phase-changeable or variable resistance property, which is configured to store data therein based on other physical effects.

In exemplary embodiments, the vertical insulator 140 includes the charge storing layer CL and a tunnel insulating layer TL that are sequentially stacked. The tunnel insulating layer TL is in contact (e.g., direct contact) with the upper semiconductor pattern USP, and the charge storing layer CL is interposed between the tunnel insulating layer TL and the upper gate electrodes 150U. In exemplary embodiments, the vertical insulator 140 further includes a blocking insulating layer BIL interposed between the charge storing layer CL and the upper gate electrodes 150U.

The charge storing layer CL may include at least one of, for example, a silicon nitride layer, a silicon oxynitride layer, a silicon-rich nitride layer, a nanocrystalline silicon layer, or a laminated trap layer. The tunnel insulating layer TL may include, for example, a material having a band gap greater than that of the charge storing layer CL. For example, the tunnel insulating layer TL may be a silicon oxide layer. The blocking insulating layer BIL may include, for example, a material having a band gap greater than that of the charge storing layer CL. In exemplary embodiments, the blocking insulating layer BIL may be, for example, a silicon oxide layer, a silicon nitride layer, and/or a silicon oxynitride layer.

In an exemplary embodiment, the vertical insulator 140 includes a capping layer which is interposed between the upper semiconductor pattern USP and the insulating layers 110. The capping layer may be in contact (e.g., direct contact) with the insulating layers 110, and may be vertically divided into a plurality of segments by the upper gate electrodes 150U. In exemplary embodiments, the capping layer is vertically extended to include portions interposed between the upper semiconductor pattern USP and the upper gate electrodes 150U. The capping layer may contain, for example, an insulating material that has an etch selectivity with respect to the charge storing layer CL, and is a different type of material than the insulating layers 110. For example, the capping layer may be at least one of a silicon layer, a silicon oxide layer, a polysilicon layer, a silicon carbide layer, or a silicon nitride layer, but the capping layer may be selected to include a different material from the insulating layers 110. In exemplary embodiments, the capping layer may be at least one of, for example, high-k dielectric layers (e.g., tantalum oxide ($Ta_2O_5$), titanium oxide ($TiO_2$), hafnium oxide ($HfO_2$), and/or zirconium oxide ($ZrO_2$)).

Referring back to FIGS. 2 and 3, in an exemplary embodiment, horizontal insulators 160 are disposed on top and bottom surfaces of each of the gate electrodes 150L and 150U. Each of the horizontal insulators 160 may further include a portion that is interposed between the upper gate electrode 150U and the vertical insulator 140, or between the lower gate electrode 150L and the gate dielectric pattern 162. Each of the horizontal insulators 160 may include a single layer or a plurality of layers. In exemplary embodiments, each of the horizontal insulators 160 may include a blocking insulating layer, which may be used as a part of a memory layer of a charge-trap type flash memory device.

In an exemplary embodiment, a conductive pad 165 is disposed on the upper semiconductor pattern USP. A top surface of the conductive pad 165 may be substantially coplanar (e.g., exactly coplanar or almost exactly coplanar within a measurement error) with a top surface of the stack SS, and a bottom surface of the conductive pad 165 may be in contact (e.g., direct contact) with the upper semiconductor pattern USP. In exemplary embodiments, the vertical insulator 140 is disposed between the conductive pad 165 and the insulating layer 110. The conductive pad 165 may be, for example, a doped region, or may include a conductive material.

Electrode separation patterns 180 may be provided at both sides of the stack SS. The electrode separation patterns 180 may be provided to cover the common source regions 170, respectively.

In an exemplary embodiment, the bit line BL is disposed on and across the stack SS. The bit line BL is coupled to the conductive pad 165 through a contact plug PLG, and is vertically spaced apart from the stack SS by an interlayered insulating layer 190.

FIGS. 7 to 15 are cross-sectional views taken along line I-I' of FIG. 2 to illustrate a method of fabricating a three-dimensional memory device according to exemplary embodiments of the inventive concept.

Figure 7:
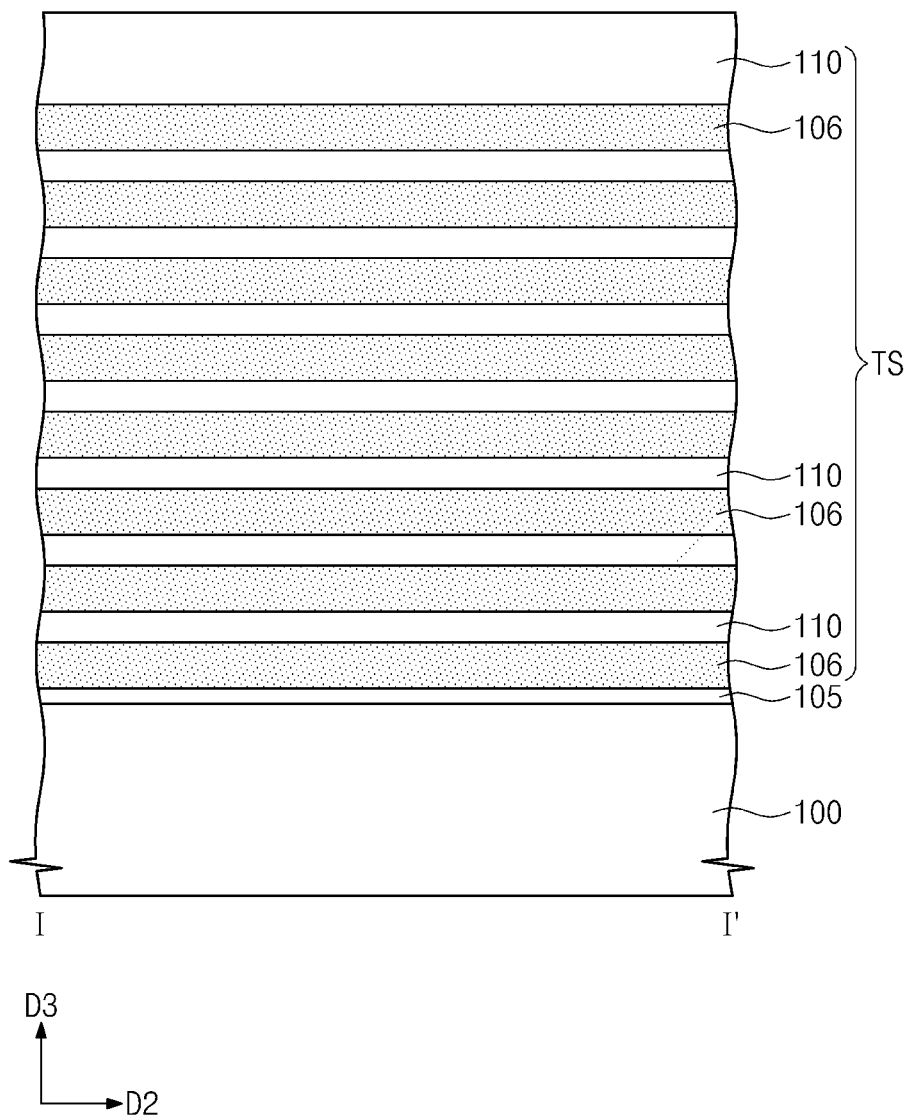
FIGS. 7 to 15 are cross-sectional views taken along line I-I' of FIG. 2 to illustrate a method of fabricating a three-dimensional memory device according to exemplary embodiments of the inventive concept.

Referring to FIG. 7, in an exemplary embodiment, the lower insulating layer 105 is formed on the substrate 100. The substrate 100 may be, for example, a silicon wafer, a germanium wafer, or a silicon-germanium wafer. The lower insulating layer 105 may be, for example, a silicon oxide layer. The lower insulating layer 105 may be formed by, for example, a thermal oxidation process or a deposition process.

Sacrificial layers 106 and insulating layers 110 are alternately and repeatedly deposited on the lower insulating layer 105, thereby forming a layered structure TS.

In exemplary embodiments, the sacrificial layers 106 are formed to have substantially the same thickness. In exemplary embodiments, the uppermost and lowermost layers of the sacrificial layers 106 are formed to be thicker than the other layers disposed therebetween. In exemplary embodiments, the insulating layers 110 are formed to have substantially the same thickness. However, in certain exemplary embodiments, at least one of the insulating layers 110 may have a thickness different from the other insulating layers 110. In exemplary embodiments, the lower insulating layer 105 is thinner than the sacrificial layers 106 and the insulating layers 110 formed thereon.

The sacrificial layers 106 and the insulating layers 110 may be formed by, for example, a thermal chemical vapor deposition (CVD) process, a plasma-enhanced CVD process, a physical CVD process, or an atomic layer deposition (ALD) process.

In exemplary embodiments, the sacrificial layers 106 and the insulating layers 110 are formed to have an etch selectivity with respect to each other. For example, the sacrificial layers 106 may be at least one of a silicon layer, a silicon oxide layer, a silicon carbide layer, a silicon oxynitride layer, or a silicon nitride layer. The insulating layers 110 may also be at least one of a silicon layer, a silicon oxide layer, a silicon carbide layer, a silicon oxynitride layer, or a silicon nitride layer, but is a material that is different from the sacrificial layer 106. For example, in an exemplary embodiment, the sacrificial layers 106 are formed of a silicon nitride layer, and the insulating layers 110 are formed of a silicon oxide layer. In exemplary embodiments, the sacrificial layers 106 are formed of a conductive material, and the insulating layers 110 are formed of an insulating material.

Figure 8:
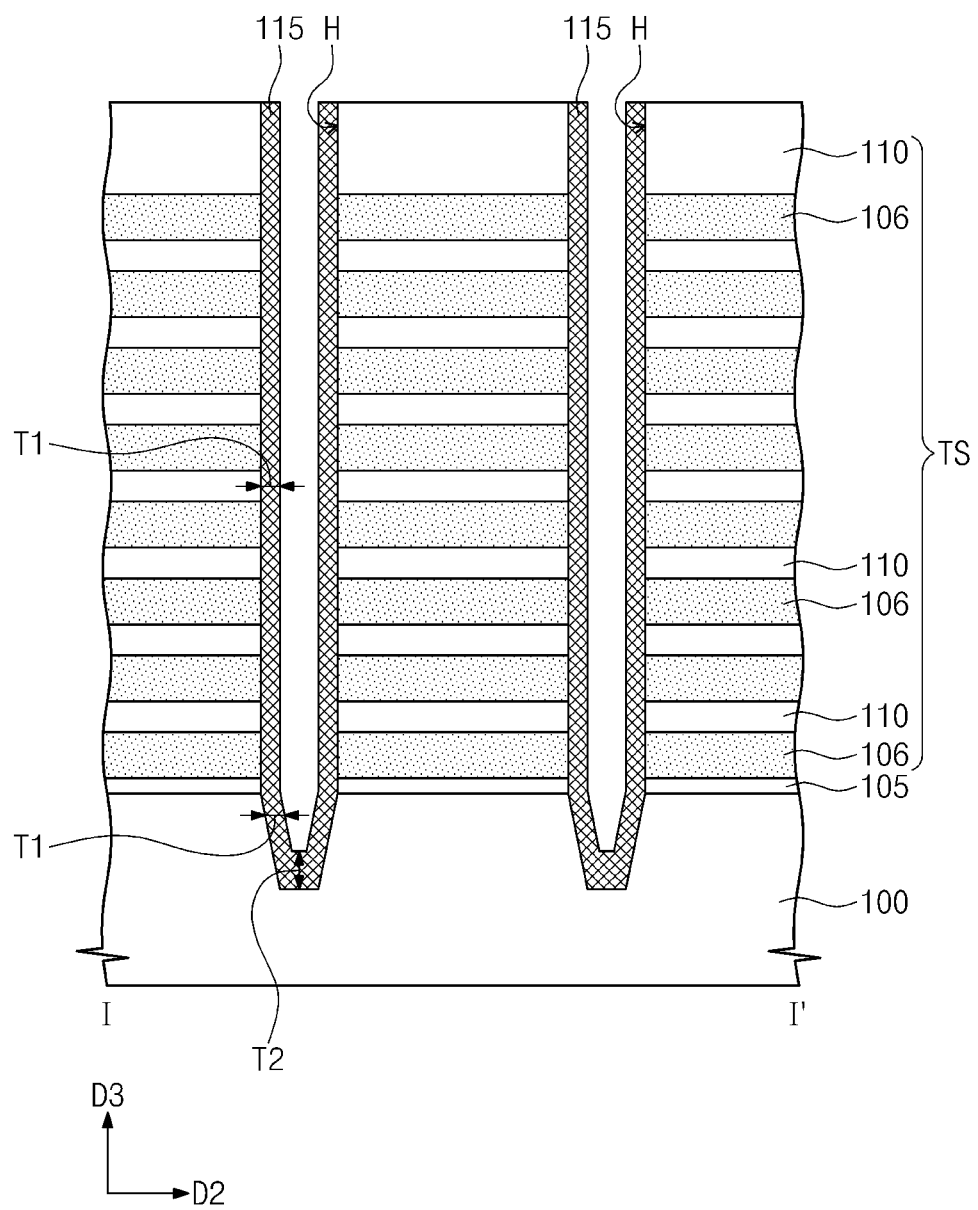

Referring to FIG. 8, in an exemplary embodiment, through holes H are formed to penetrate the layered structure TS and expose the substrate 100. A plurality of the through holes H may be formed in the layered structure TS and may be two-dimensionally arranged when viewed in a plan view. In exemplary embodiments, the through holes H are arranged in the first direction D1. In exemplary embodiments, the through holes H are arranged in a zigzag pattern in the first direction D1. Referring back to FIGS. 2 and 3, in an exemplary embodiment, a through hole H penetrates the gate electrodes (e.g., gate electrodes 150L and 150U) and a portion of the substrate 100, and the channel structure CS is disposed in the through hole H. The residue layer 115 and the void 118 are disposed in a lower region of the through hole H. An upper boundary of the void 118 is defined by a bottom surface of the lower semiconductor pattern LSP, and a lower boundary of the void is defined by an upper surface of the residue layer 115. The bottom surface of the lower semiconductor pattern LSP may have a curved shape, and the upper surface of the residue layer 115 may have a substantially flat shape (e.g., exactly flat or almost exactly flat within a measurement error as would be understood by one having ordinary skill in the art).

The formation of the through holes H may include forming a first mask pattern, which has a plurality of openings defining positions of the through holes H, on the layered structure TS, and then anisotropically etching the layered structure TS using the first mask pattern as an etch mask. The first mask pattern may be formed of a material having an etch selectivity with respect to the sacrificial layers 106 and the insulating layers 110. The etching process may be performed to etch a top surface of the substrate 100 in an over-etch manner, and thus, the top surface of the substrate 100 may be partially recessed. That is, at least a portion of the substrate 100 may be recessed by the through hole H. In exemplary embodiments, as shown in FIG. 8, a lower region of the through hole H positioned in the substrate 100 may have a width increasing in a direction away from the top surface of the substrate 100 (e.g., in the third direction D3).

After the etching process, an etch residue may be deposited on side and bottom surfaces of the through hole H to form the residue layer 115. The residue layer 115 may further include, for example, a native oxide layer formed on the side and bottom surfaces of the through hole H. The residue layer 115 may contain at least one of, for example, carbon and oxygen.

Depending on etching characteristics of the anisotropic etching process, the residue layer 115 may be formed to be thicker on the bottom surface of the through hole H than on the side surface of the through hole H. As an example, in an exemplary embodiment, the residue layer 115 has a first thickness T1 on the side surface of the through hole H and a second thickness T2 on the bottom surface of the through hole H. The second thickness T2 is greater than the first thickness T1.

Figure 9:
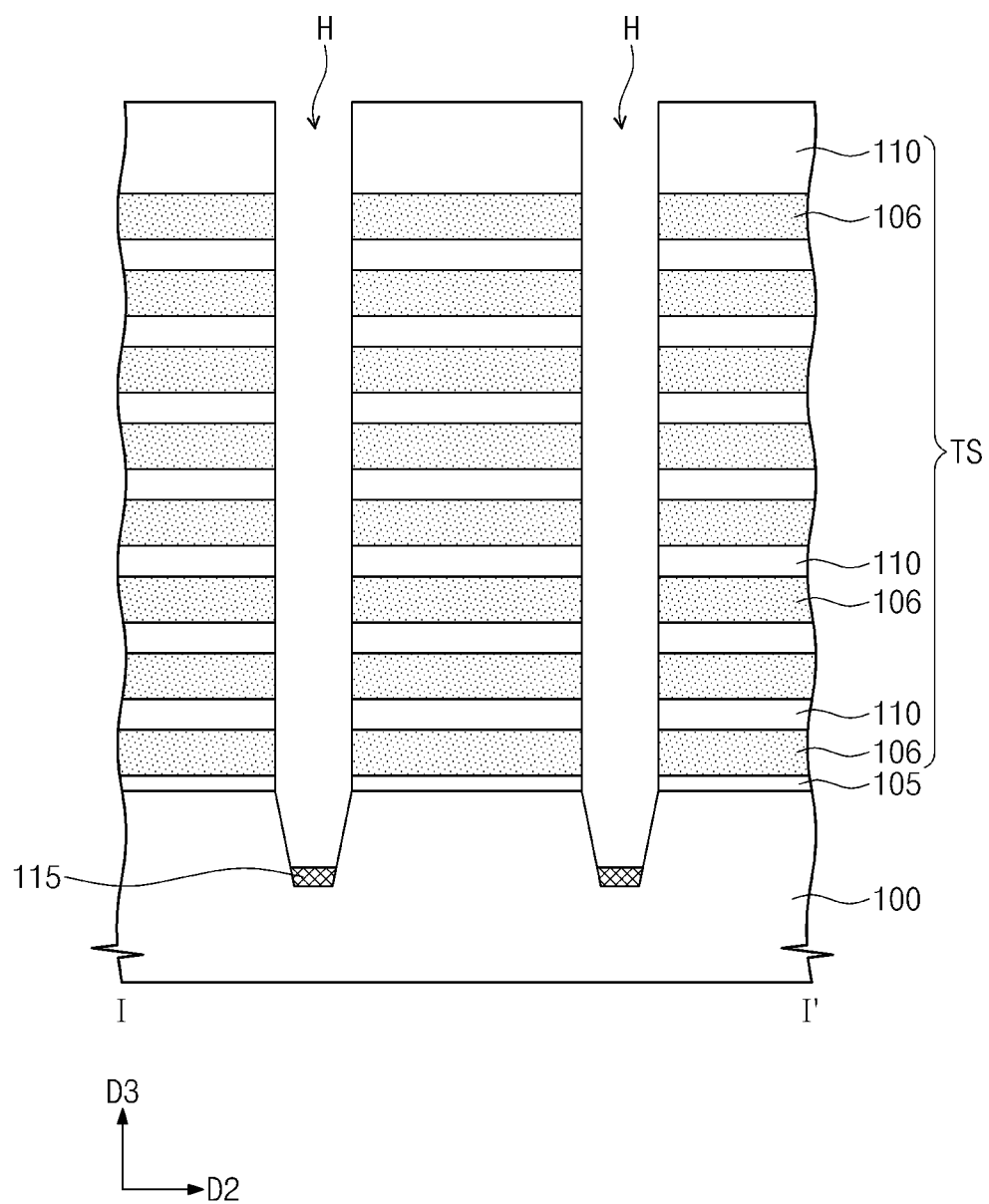

Referring to FIG. 9, a cleaning process is performed to remove at least a portion of the residue layer 115 from the through hole H. The cleaning process may be performed using, for example, a plasma treatment process, in which $NH_3$ or $Cl_2$ gas is used, an ashing process, and/or a strip process.

The cleaning process may be performed until the residue layer 115 is removed from the side surface of the through hole H. Accordingly, after the cleaning process is performed, an inner side surface of the substrate 100 may be exposed by the through hole H. Since the residue layer 115 is thicker on the bottom surface of the through hole H than on the side surface of the through hole H, a portion of the residue layer 115 may remain on the bottom surface of the through hole H when the cleaning process is finished. The remaining portion of the residue layer 115 may be locally present in the through hole H.

Figure 10:
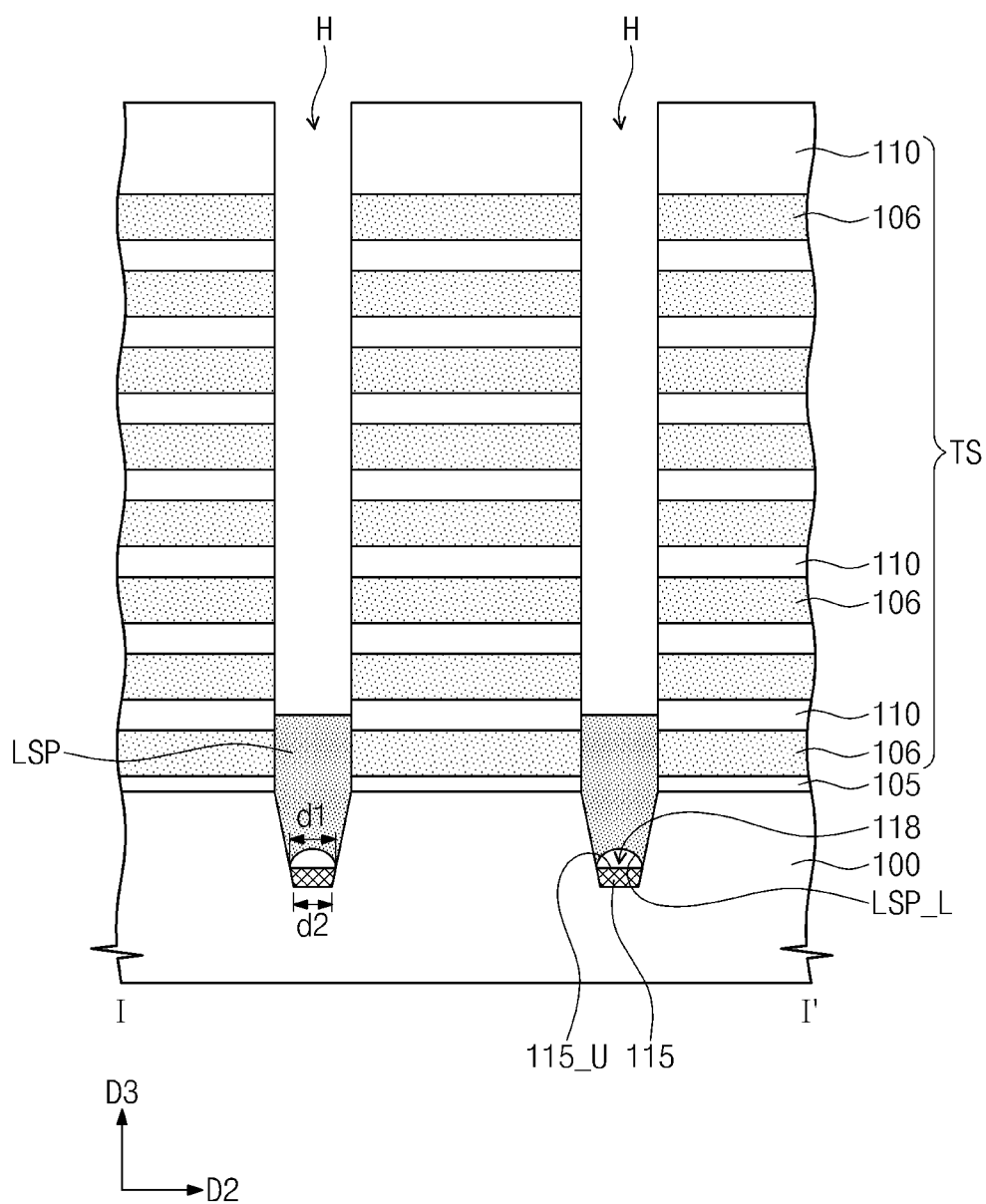

Referring to FIG. 10, the lower semiconductor pattern LSP is formed to fill the lower region of the through hole H. The lower semiconductor pattern LSP may be formed, for example, by a selective epitaxial growth (SEG) process, in which the substrate 100 exposed by the through hole H is used as a seed layer. In this case, the epitaxial growth of the lower semiconductor pattern LSP may be suppressed on the residue layer 115. In the process of growing the lower semiconductor pattern LSP, only the inner side surface of the substrate 100 exposed by the through hole H may be used as a seed layer. Accordingly, the void 118 may be formed between the lower semiconductor pattern LSP and the residue layer 115. The void 118 may be locally formed in the through hole H.

In exemplary embodiments, the lower semiconductor pattern LSP may be formed to have a pillar-shaped structure that is inserted into a top portion of the substrate 100. The void 118 may be interposed between the bottom surface LSP_L of the lower semiconductor pattern LSP and the bottom surface of the through hole. The bottom surface LSP_L of the lower semiconductor pattern LSP may be lower than the top surface of the substrate 100 and may constitute/form a portion of an inner surface of the void 118. In exemplary embodiments, the bottom surface LSP_L of the lower semiconductor pattern LSP may have a curved shape. The residue layer 115 may be interposed between the void 118 and the bottom surface of the through hole. The residue layer 115 may have a top surface 115_U constituting/forming the inner surface of the void 118, in conjunction with the bottom surface LSP_L of the lower semiconductor pattern LSP. The void 118 may be defined by the bottom surface LSP_L of the lower semiconductor pattern LSP and the top surface 115_U of the residue layer 115. That is, in exemplary embodiments, the void 118 is an empty space having its boundaries defined by the lower semiconductor pattern LSP and the residue layer 115. In exemplary embodiments, the top surface 115_U of the residue layer 115 may be substantially flat (e.g., exactly flat or almost exactly flat within a measurement error).

When viewed in a cross-sectional view, in an exemplary embodiment, the void 118 has a first diameter d1 that is greater than a second diameter d2 of the bottom surface of the through hole H by about 50%. Here, the first diameter d1 is the maximum distance between inner side surfaces of the void 118, and the second diameter d2 is the maximum diameter of the bottom surface of the through hole H. The first diameter d1 and the second diameter d2 may be values measured in a direction parallel to the top surface of the substrate 100.

In a comparative example, in a case in which a plurality of the through holes H are formed, the cleaning process may be performed until the residue layer 115 is removed from the inner side and bottom surfaces of each of the through holes H. In this case, since, in each of the through holes H, the residue layer 115 is thicker on the bottom surface than on the inner side surface of the through hole H, the residue layer 115 may not be completely removed from all of the bottom surfaces of the through holes H. That is, in a comparative example, a portion of the residue layer 115 may remain on the bottom surface of at least one of the through holes H. The epitaxial growth of the lower semiconductor pattern LSP may be suppressed on the residue layer 115. That is, the epitaxial growth of the lower semiconductor pattern LSP may be suppressed on the bottom surface of at least one of the through holes H. In this case, the lower semiconductor patterns LSP in the through holes H may be formed to have heights different from one another. That is, in a comparative example, there may be a spatial variation in height of the lower semiconductor patterns LSP. This may lead to electrical failures (e.g., a leakage current between the lower semiconductor patterns LSP and gate electrodes) of a three-dimensional semiconductor memory device.

According to exemplary embodiments of the inventive concept, the cleaning process is performed until the residue layer 115 is removed from the inner side surface of each of the through holes H. That is, a portion of the residue layer 115 may remain on the bottom surface of each of the through holes H. In this case, according to exemplary embodiments, only the inner side surface of the substrate 100 exposed by each of the through holes H is used as a seed layer for growing the lower semiconductor pattern LSP. As a result, the lower semiconductor patterns LSP are formed to have substantially the same height as one another. Thus, exemplary embodiments of the inventive concept improve height uniformity of the lower semiconductor patterns LSP, resulting in a three-dimensional memory device having improved electrical characteristics.

In exemplary embodiments, the lower semiconductor pattern LSP is formed to cover a side surface of at least one of the sacrificial layers 106. For example, a top surface of the lower semiconductor pattern LSP may be positioned between vertically adjacent sacrificial layers 106.

The lower semiconductor pattern LSP may include a portion having a single-crystalline or poly-crystalline structure. The lower semiconductor pattern LSP may include, for example, a silicon layer. However, exemplary embodiments of the inventive concept are not limited thereto. For example, according to exemplary embodiments, at least one of carbon nano structures, organic semiconductor materials, or compound semiconductors may be used as the lower semiconductor pattern LSP.

In exemplary embodiments, the lower semiconductor pattern LSP is formed to have the same conductivity type as the substrate 100. In exemplary embodiments, the lower semiconductor pattern LSP is doped in-situ during the SEG process. Alternatively, impurities may be injected into the lower semiconductor pattern LSP after the formation of the lower semiconductor pattern LSP.

Figure 11:
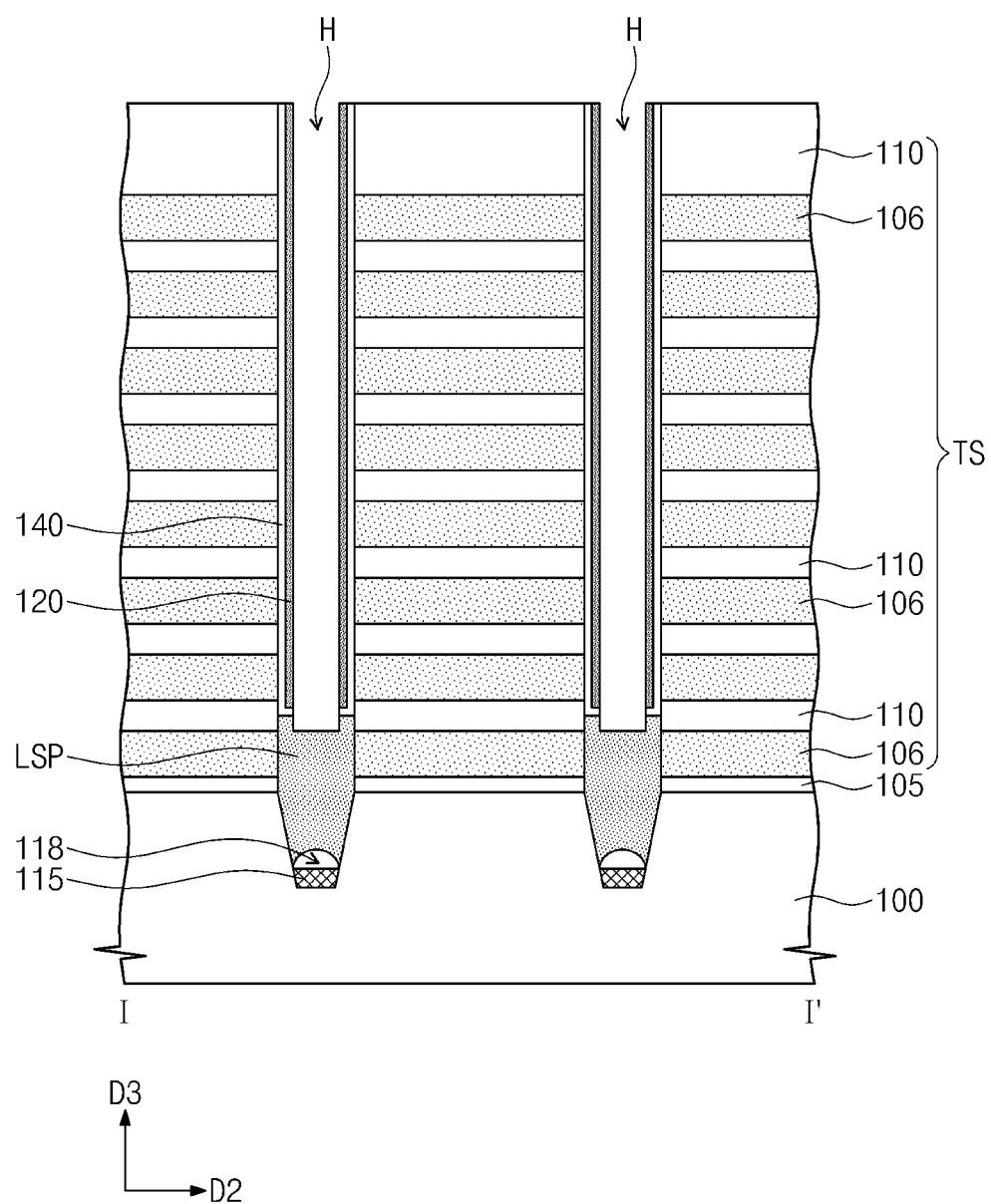

Referring to FIG. 11, the vertical insulator 140 and the first semiconductor pattern 120 are formed to cover the inner side surface of the through hole H provided with the lower semiconductor pattern LSP, and to expose the lower semiconductor pattern LSP.

For example, in an exemplary embodiment, a vertical insulating layer and a first semiconductor layer are sequentially formed in the through hole H provided with the lower semiconductor pattern LSP. The vertical insulating layer and the first semiconductor layer may be formed to partially fill the through hole H. For example, the entire region of the through hole H may not be filled with the vertical insulating layer and the first semiconductor layer. In addition, the vertical insulating layer may be formed to cover the top surface of the lower semiconductor pattern LSP exposed by the through hole H. The vertical insulating layer may include a plurality of layers deposited by, for example, a plasma-enhanced chemical vapor deposition (PE-CVD) process, a physical vapor deposition (PVD) process, or an atomic layer deposition (ALD) process.

The vertical insulating layer may include, for example, a charge storing layer serving as a memory element of flash memory devices. The charge storing layer may be, for example, a trap insulating layer or an insulating layer including conductive nanodots. Alternatively, the vertical insulating layer may include a phase-changeable element or a variable resistance element.

In exemplary embodiments, as shown in FIG. 6, the vertical insulating layer may include the blocking insulating layer BIL, the charge storing layer CL, and the tunnel insulating layer TL, which are sequentially stacked on the side surface of the through hole H. The blocking insulating layer BIL may cover the side surfaces of the sacrificial layers 106 and the insulating layers 110, as well as the top surface of the lower semiconductor pattern LSP exposed by the through hole H. The blocking insulating layer BIL may be formed of, for example, a silicon oxide layer, a hafnium oxide layer, or an aluminum oxide layer. The charge storing layer CL may include, for example, a trap insulating layer or an insulating layer with conductive nano dots. In exemplary embodiments, the charge storing layer CL may include at least one of, for example, a silicon nitride layer, a silicon oxynitride layer, a silicon-rich nitride layer, a nano-crystalline silicon layer, or a laminated trap layer. The tunnel insulating layer TL may be one of materials having band gaps that are larger than those of the charge storing layer CL. For example, the tunnel insulating layer TL may be a silicon oxide layer.

The first semiconductor layer may be formed on the vertical insulating layer. In exemplary embodiments, the first semiconductor layer may be, for example, a semiconductor material (e.g., a poly-crystalline silicon layer, a single-crystalline silicon layer, or an amorphous silicon layer) which is formed by one of ALD or CVD techniques.

The first semiconductor layer and the vertical insulating layer may be anisotropically etched to expose the top surface of the lower semiconductor pattern LSP. Accordingly, the first semiconductor pattern 120 and the vertical insulator 140 may be formed on the side surface of the through hole H. For example, in an exemplary embodiment, the vertical insulator 140 and the first semiconductor pattern 120 are formed to have a cylindrical structure with open top and bottom ends.

In exemplary embodiments, the anisotropic etching of the first semiconductor layer and the vertical insulating layer may be performed in an over-etch manner. In this case, the lower semiconductor pattern LSP exposed by the first semiconductor pattern 120 and the vertical insulator 140 may have a recessed top surface.

During the anisotropic etching process, a portion of the vertical insulating layer positioned under the first semiconductor pattern 120 may not be etched. In this case, the vertical insulator 140 may include a bottom portion that is interposed between the first semiconductor pattern 120 and the lower semiconductor pattern LSP. Accordingly, a bottom surface of the vertical insulator 140 may be in contact (e.g., direct contact) with at least a portion of the top surface of the lower semiconductor pattern LSP.

The top surface of the layered structure TS may be exposed after the anisotropic etching process of the first semiconductor layer and the vertical insulating layer. Accordingly, the vertical insulator 140 and the first semiconductor pattern 120 may be locally formed in each of the through holes H, which are two-dimensionally arranged on the substrate 100.

Figure 12:
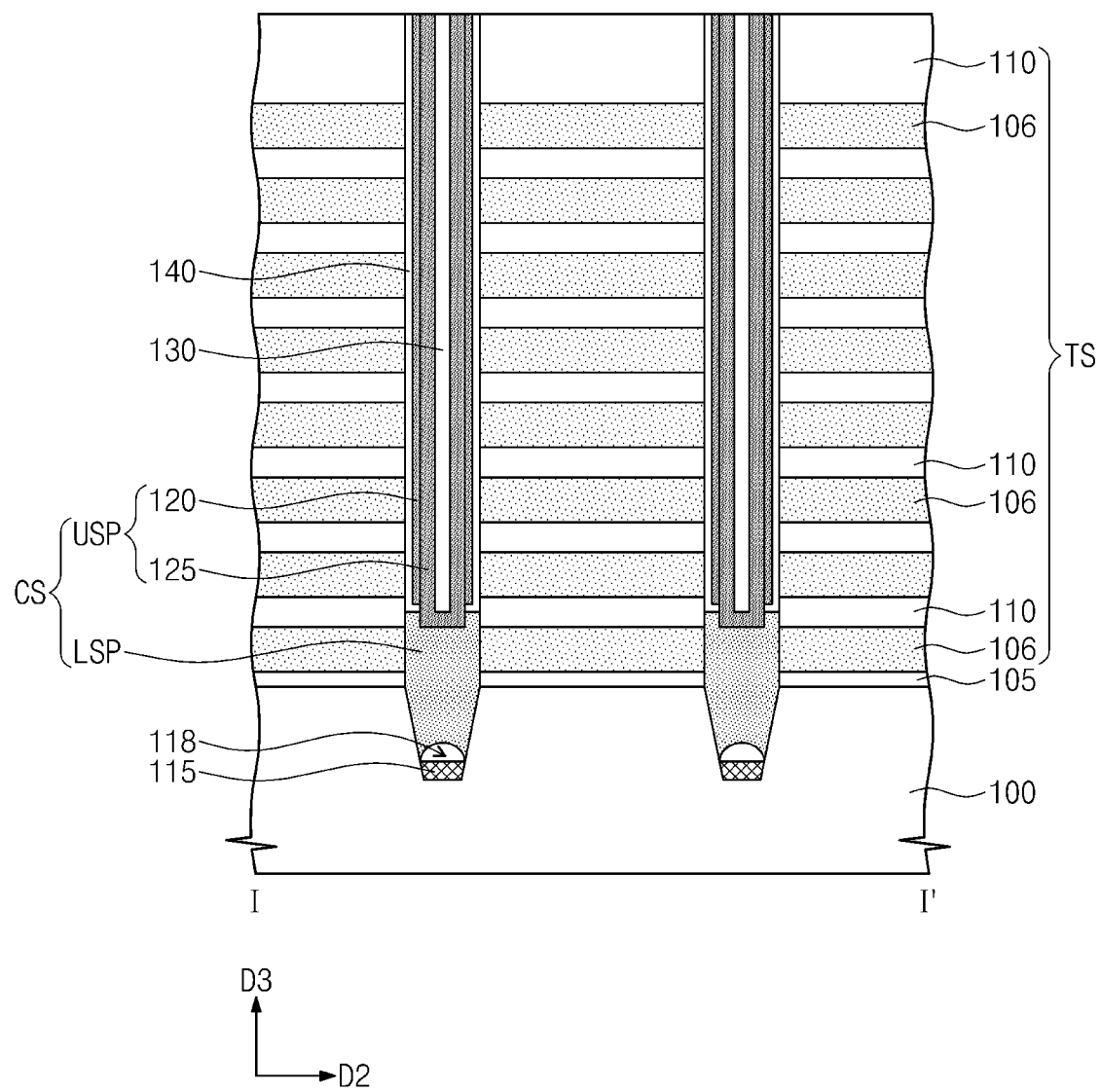

Referring to FIG. 12, the second semiconductor pattern 125 and the insulating gapfill pattern 130 are provided on the resulting structure having the vertical insulator 140 and the first semiconductor pattern 120.

For example, in an exemplary embodiment, a second semiconductor layer and an insulating gapfill layer are sequentially formed in the through hole H provided with the vertical insulator 140 and the first semiconductor pattern 120. The second semiconductor layer may be conformally formed in the through hole H, and the second semiconductor layer may be formed such that it has a thickness that is thin enough such that the second semiconductor layer does not completely fill the through hole H. The second semiconductor layer connects the lower semiconductor pattern LSP to the first semiconductor pattern 120. The second semiconductor layer may be a semiconductor material such as, for example, a poly-crystalline silicon layer, a single-crystalline silicon layer, or an amorphous silicon layer, which is formed by one of, for example, ALD or CVD techniques. The insulating gapfill layer may be formed to completely fill the through hole H provided with the second semiconductor layer. The insulating gapfill layer may be one of, for example, a spin-on-glass (SOG) insulating layer and a silicon oxide layer. Thereafter, the second semiconductor layer and the insulating gapfill layer may be planarized to expose the top surface of the layered structure TS. Thus, the second semiconductor pattern 125 and the insulating gapfill pattern 130 may be locally formed in the through hole H.

In an exemplary embodiment, the second semiconductor pattern 125 is formed to have a pipe-shaped or hollow-cylindrical structure having one closed end. For example, the second semiconductor pattern 125 may be shaped like a cup. In exemplary embodiments, the second semiconductor pattern 125 may be formed to fill the through hole H. For example, the second semiconductor pattern 125 may have a solid pillar structure.

The insulating gapfill pattern 130 may be formed to fill the through hole H provided with the second semiconductor pattern 125.

Together, the first and second semiconductor patterns 120 and 125 form the upper semiconductor pattern USP. The upper semiconductor pattern USP is formed on the lower semiconductor pattern LSP. The upper semiconductor pattern USP and the lower semiconductor pattern LSP together form a channel structure CS.

Figure 13:
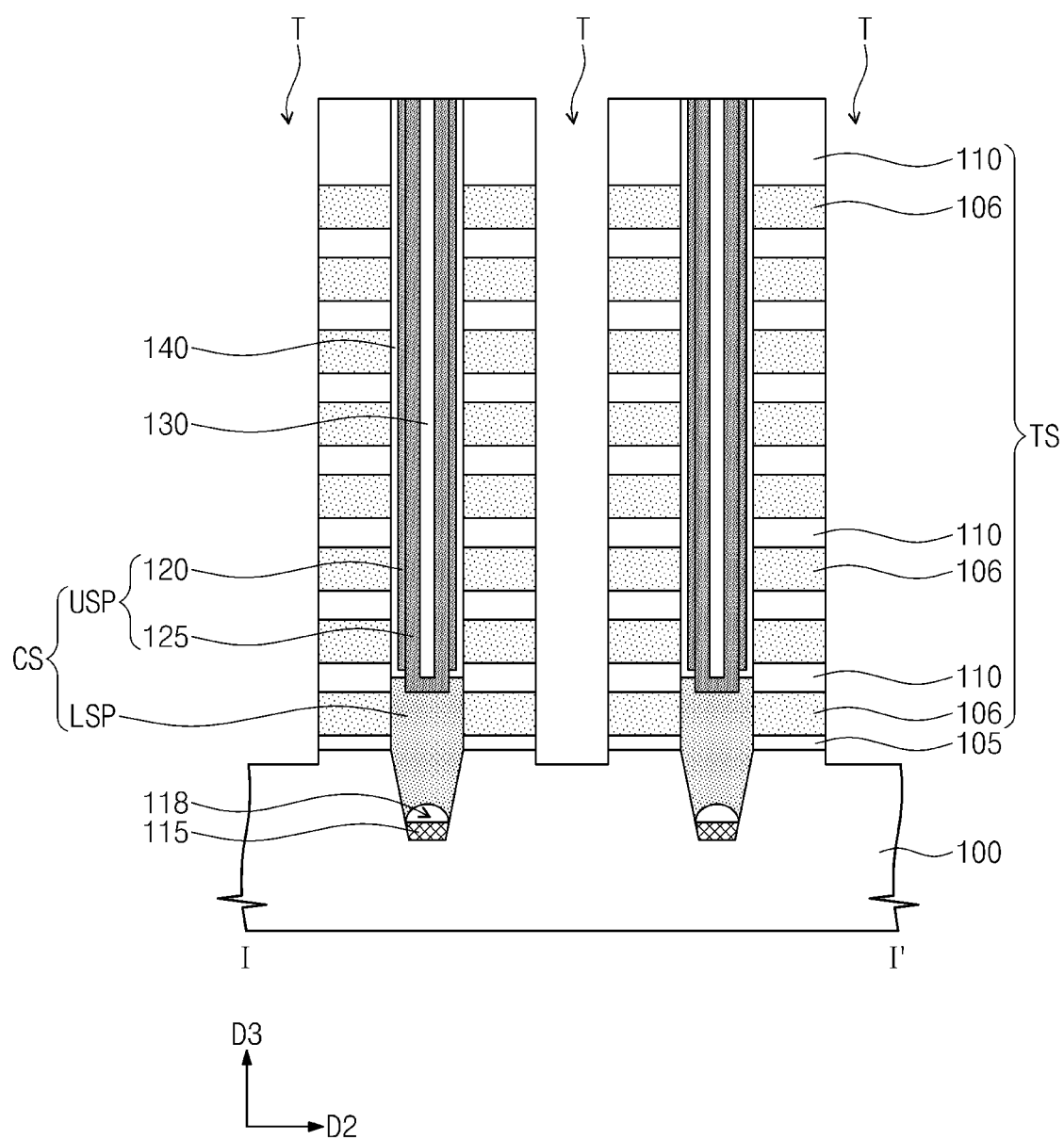

Referring to FIG. 13, in an exemplary embodiment, the layered structure TS is patterned to form trenches T between the channel structures CS adjacent to one another. In exemplary embodiments, the trenches T are formed to expose the substrate 100.

The formation of the trenches T may include, for example, forming second mask patterns on the layered structure TS to define positions of the trenches T, and then, anisotropically etching the layered structure TS using the second mask patterns as an etch mask.

In an exemplary embodiment, the trenches T are formed to be spaced apart from the upper and lower semiconductor patterns USP and LSP, and to expose side surfaces of the sacrificial and insulating layers 106 and 110. When viewed in a plan view, each of the trenches T may be shaped like a line or rectangle. When viewed in a cross-sectional view, the trenches T may be formed to expose the top surface of the substrate 100. During the etching process, the substrate 100 may be over-etched to have a recessed top surface. A width of the trench T may vary depending on a distance from the substrate 100. For example, a bottom width of the trench T may be smaller than a top width thereof.

As a result of the formation of the trenches T, the layered structure TS may have a plurality of elongated line-shaped portions. A plurality of the channel structures CS may be provided through each of the line-shaped portions of the layered structure TS.

Figure 14:
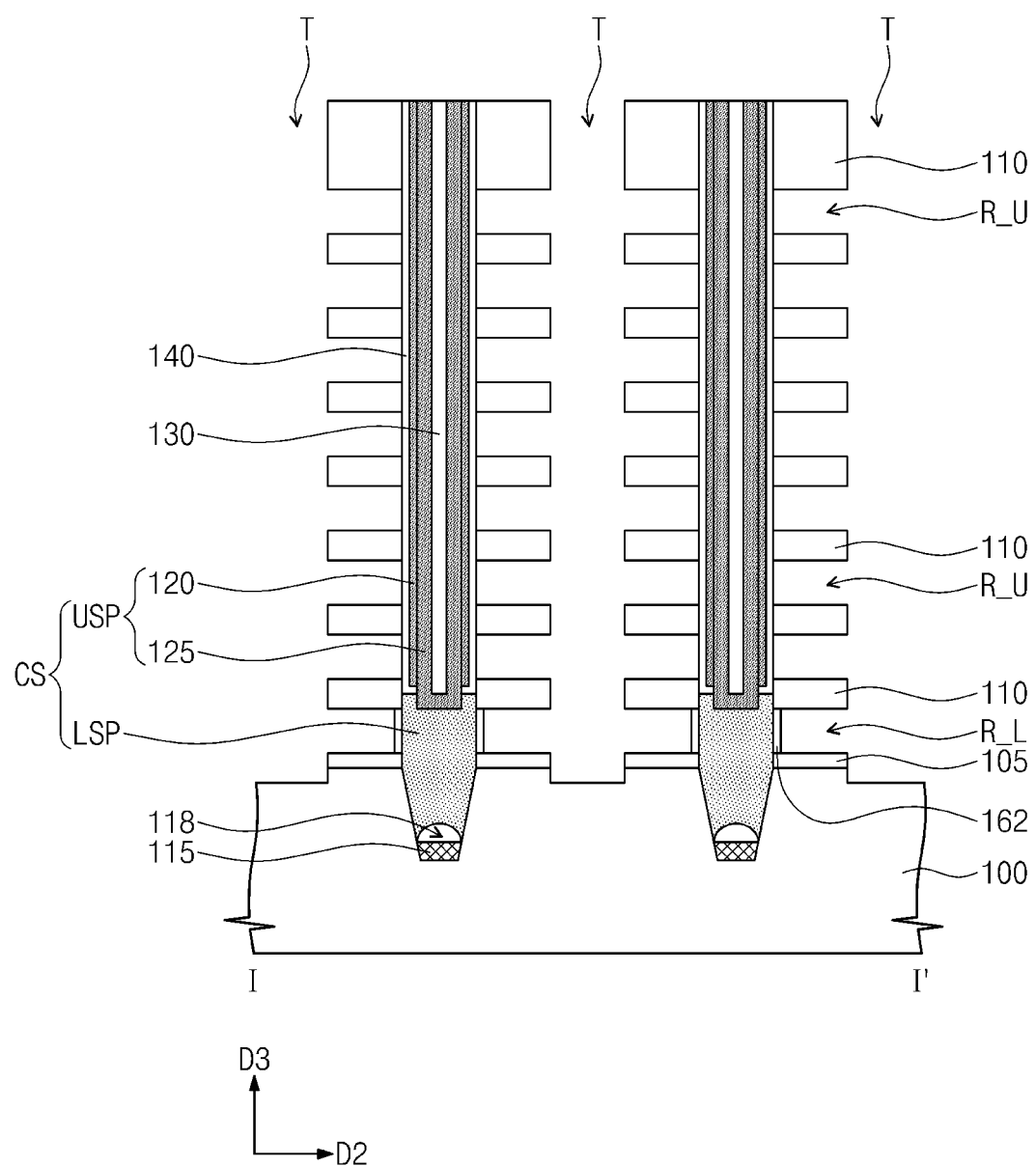

Referring to FIG. 14, the sacrificial layers 106 exposed by the trenches T are removed to form lower and upper recess regions R_L and R_U between the insulating layers 110.

For example, the lower and upper recess regions R_L and R_U may be formed by removing the sacrificial layers 106 using an isotropic etching process. In exemplary embodiments, the isotropic etching process may be performed using an etching recipe having a sufficiently high etch selectivity with respect to the insulating layers 110, the vertical insulator 140, the lower semiconductor pattern LSP, the lower insulating layer 105, and the substrate 100. For example, in a case in which the sacrificial layers 106 are formed of a silicon nitride layer and the insulating layers 110 are formed of a silicon oxide layer, the etching process may be performed using an etching solution containing phosphoric acid.

In an exemplary embodiment, the lower recess region R_L is horizontally extended from the trenches T to a region between the insulating layers 110 and the lower insulating layer 105, and the sidewall of the lower semiconductor pattern LSP is partially exposed by the lower recess region R_L. The upper recess regions R_U is horizontally extended from the trenches T to regions between the insulating layers 110, and the sidewalls of the vertical insulator 140 are partially exposed by the upper recess regions R_U. For example, the lower recess region R_L may be delimited by vertically adjacent layers of the insulating layers 110 and 105 and the side surface of the lower semiconductor pattern LSP, and the upper recess regions R_U may be delimited by vertically adjacent layers of the insulating layers 110 and the side surface of the vertical insulator 140.

In an exemplary embodiment, each of the lower and upper recess regions R_L and R_U have substantially the same vertical thickness as a thickness of a corresponding one of the sacrificial layers 106. In exemplary embodiments, the lower recess region R_L has a vertical thickness larger than those of the upper recess regions R_U. Alternatively, in an exemplary embodiment, the lower and upper recess regions R_L and R_U have substantially the same vertical thickness as each other.

After the formation of the recess regions R_U and R_L, a gate dielectric pattern 162 is formed in the lower recess region R_L. The gate dielectric pattern 162 may be formed, for example, by a thermal oxidation process. In this case, the side surface of the lower semiconductor pattern LSP exposed by the lower recess region R_L may be partially oxidized. The gate dielectric pattern 162 may include, for example, a silicon oxide layer.

Figure 15:
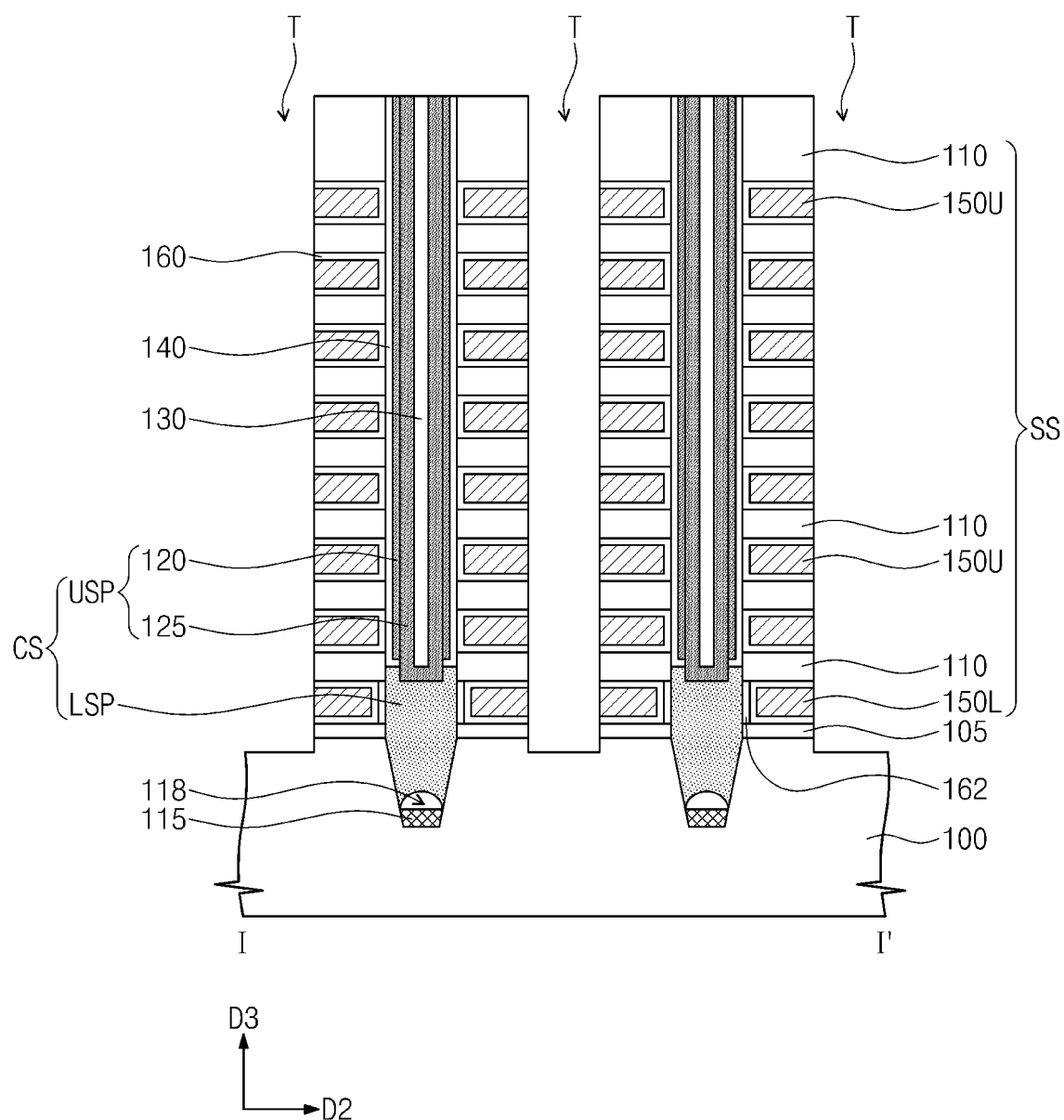

Referring to FIG. 15, in an exemplary embodiment, horizontal insulators 160 are formed to cover inner side surfaces of the lower and upper recess regions R_L and R_U, and lower and upper gate electrodes 150L and 150U are formed to fill remaining regions of the lower and upper recess regions R_L and R_U provided with the horizontal insulators 160.

The formation of the horizontal insulators 160 and the lower and upper gate electrodes 150L and 150U may include sequentially forming a horizontal insulating layer and a conductive layer in the lower and upper recess regions R_L and R_U, and then removing the horizontal insulating layer and the conductive layer from the trenches T to locally form the horizontal insulators 160 and the lower and upper gate electrodes 150L and 150U in the lower and upper recess regions R_L and R_U.

Similar to the vertical insulating layer, the horizontal insulating layer may be a single layer or may include a plurality of layers. In exemplary embodiments, the horizontal insulating layer may include a blocking insulating layer constituting a memory cell transistor of a charge-trap flash memory device. As previously described with reference to FIG. 6, the blocking insulating layer may be one of materials having band gaps that are smaller than those of the tunnel insulating layer TL and larger than those of the charge storing layer CL. The blocking insulating layer may be, for example, high-k dielectrics (e.g., aluminum oxide and hafnium oxide).

The conductive layer may be formed to fill the lower and upper recess regions R_L and R_U provided with the horizontal insulating layer and to conformally cover the inner surfaces of the trenches T. In this case, the formation of the lower and upper gate electrodes 150L and 150U may include removing the conductive layer from the trenches T using an isotropic etching process. In exemplary embodiments, the conductive layer may be formed to fill the trenches T. In this case, the lower and upper gate electrodes 150L and 150U may be formed by performing an anisotropic etching process to remove the conductive layer from the trenches T. In exemplary embodiments, the upper gate electrodes 150U may be formed in the upper recess regions R_U, respectively, and the lower gate electrode 150L may be formed in the lower recess region R_L. The formation of the conductive layer may include sequentially depositing a barrier metal layer and a metal layer. The barrier metal layer may include or be formed of at least one of metal nitrides such as, for example, TiN, TaN, or WN, and the metal layer may include or be formed of at least one of metallic materials such as, for example, W, Al, Ti, Ta, Co, or Cu.

In the upper recess regions R_U, the horizontal insulators 160 may be in contact (e.g., direct contact) with the vertical insulator 140. In the lower recess region R_L, the horizontal insulators 160 may be in contact (e.g., direct contact) with the gate dielectric pattern 162 covering the lower semiconductor pattern LSP.

The gate electrodes 150L and 150U and the insulating layers 110 interposed therebetween may constitute the stack SS.

After the formation of the lower and upper gate electrodes 150L and 150U, common source regions 170 may be formed in the substrate 100. The common source regions 170 may be formed by performing an ion implantation process on the substrate 100 exposed by the trenches T. The common source regions 170 may be formed to have a conductivity type different from the lower semiconductor pattern LSP. Alternatively, a portion of the substrate 100 in contact with the lower semiconductor pattern LSP may be formed to have the same conductivity type as the lower semiconductor pattern LSP. In a flash memory device according to exemplary embodiments of the inventive concept, the common source regions 170 may be connected to each other to be in an equipotential state. In exemplary embodiments, the common source regions 170 may be electrically separated from each other to have electric potentials different from each other. In exemplary embodiments, the common source regions 170 may constitute a plurality of source groups, which are electrically separated from each other to have electric potentials different from each other, and each of which includes a plurality of common source regions 170.

Referring back to FIG. 3, in an exemplary embodiment, the electrode separation patterns 180 are formed on the common source regions 170 to fill the trenches T. The electrode separation patterns 180 may be formed of at least one of, for example, a silicon oxide layer, a silicon nitride layer, or a silicon oxynitride layer.

In addition, in an exemplary embodiment, the conductive pad 165 is formed to be connected to the first and second semiconductor patterns 120 and 125. The conductive pad 165 may be formed by recessing upper portions of the first and second semiconductor patterns 120 and 125 and then filling the recessed regions with a conductive material. Alternatively, the conductive pad 165 may be formed by doping the first and second semiconductor patterns 120 and 125 with impurities. In this case, the conductive pad 165 may have a different conductivity type from that of the first and second semiconductor patterns 120 and 125.

Thereafter, on the stack SS, the contact plug PLG may be formed to be connected to the conductive pad 165, and the bit line BL may be formed to be connected to the contact plug PLG. The bit line BL may be electrically connected to the first and second semiconductor patterns 120 and 125 through the contact plug PLG. The bit line BL may be formed to cross the lower and upper gate electrodes 150L and 150U or the trenches T. The bit line BL may be formed to be spaced apart from the stack SS by the interlayered insulating layer 190.

According to exemplary embodiments of the inventive concept, a through hole is provided to penetrate a portion of a substrate, and a lower semiconductor pattern is provided in the through hole. A residue layer is locally provided in the through hole and below the lower semiconductor pattern. A void, which is delimited by the lower semiconductor pattern and the residue layer, is provided in the through hole.

The lower semiconductor pattern may be an epitaxial pattern grown using a portion of the substrate, which is exposed by the through hole, as a seed layer. The presence of the residue layer may suppress the lower semiconductor pattern from being grown on a bottom surface of the through hole, and thus, only an inner side surface of the substrate exposed by the through hole may be used as a seed layer for growing the lower semiconductor pattern. Accordingly, the lower semiconductor patterns can be formed to have substantially the same height. Thus, according to exemplary embodiments of the inventive concept, height uniformity of the lower semiconductor patterns may be improved, resulting in a three-dimensional memory device having improved electrical characteristics and high reliability.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an exemplary embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A three-dimensional (3D) semiconductor device, comprising:
    a plurality of gate electrodes stacked on a substrate in a direction normal to a top surface of the substrate;
    a channel structure passing through the gate electrodes and connected to the substrate; and
    a void disposed in the substrate and positioned below the channel structure.

2. The 3D semiconductor device of claim 1, further comprising:
    a residue layer disposed in the substrate and positioned below the channel structure, wherein the void is disposed between the channel structure and the residue layer.

3. The 3D semiconductor device of claim 2, wherein the channel structure comprises:
    a lower semiconductor pattern partially disposed within the substrate; and
    an upper semiconductor pattern spaced apart from the substrate,
    wherein the lower semiconductor pattern is disposed between upper semiconductor pattern and the substrate, and the void is disposed between the lower semiconductor pattern and the residue layer.

4. The 3D semiconductor device of claim 3, wherein the void is defined by a bottom surface of the lower semiconductor pattern and a top surface of the residue layer.

5. The 3D semiconductor device of claim 4, wherein the bottom surface of the lower semiconductor pattern is positioned at a lower level than the top surface of the substrate.

6. The 3D semiconductor device of claim 4, wherein the bottom surface of the lower semiconductor pattern has a curved shape.

7. The 3D semiconductor device of claim 3, wherein the lower semiconductor pattern is an epitaxial pattern that is grown using the substrate as a seed layer.

8. The 3D semiconductor device of claim 3, wherein the residue layer comprises at least one of carbon and oxygen.

9. The 3D semiconductor device of claim 2, further comprising:
    a through hole penetrating the gate electrodes and a portion of the substrate,
    wherein the channel structure is disposed in the through hole, and the residue layer and the void are disposed in a lower region of the through hole.

10. The 3D semiconductor device of claim 1, further comprising:
    a plurality of channel structures including the channel structure, and a plurality of voids including the void,
    wherein the channel structures are spaced apart from one another in a direction substantially parallel to the top surface of the substrate, the voids are spaced apart from one another in the direction substantially parallel to the top surface of the substrate, and each of the voids is positioned below a corresponding one of the channel structures.

11. A three-dimensional (3D) semiconductor device, comprising:
    a plurality of gate electrodes stacked on a substrate in a first direction normal to a top surface of the substrate;
    a channel structure disposed in a through hole, wherein the through hole passes through the gate electrodes and at least a portion of the substrate, and the channel structure extends in the first direction; and
    a void disposed in the through hole and positioned below the channel structure,
    wherein the channel structure comprises a lower semiconductor pattern in contact with the substrate, and the lower semiconductor pattern comprises a bottom surface forming a portion of an inner surface of the void.

12. The 3D semiconductor device of claim 11, wherein the bottom surface of the lower semiconductor pattern is positioned at a lower level than the top surface of the substrate.

13. The 3D semiconductor device of claim 12, wherein the bottom surface of the lower semiconductor pattern has a curved shape.

14. The 3D semiconductor device of claim 12, wherein the void is disposed between the bottom surface of the lower semiconductor pattern and a bottom surface of the through hole.

15. The 3D semiconductor device of claim 14, further comprising:

a residue layer disposed in the through hole and positioned below the channel structure,
  wherein the residue layer is disposed between the void and the bottom surface of the through hole.

16. The 3D semiconductor device of claim 15, wherein the residue layer comprises a top surface forming another portion of the inner surface of the void.

17. The 3D semiconductor device of claim 15, wherein the residue layer comprises at least one of carbon and oxygen.

18. The 3D semiconductor device of claim 11, wherein the lower semiconductor pattern is an epitaxial pattern that is grown using the substrate exposed by the through hole as a seed layer.

19. The 3D semiconductor device of claim 11, wherein the channel structure further comprises:
  an upper semiconductor pattern spaced apart from the substrate,
  wherein the lower semiconductor pattern is disposed between the upper semiconductor pattern and the substrate.

20. A three-dimensional (3D) semiconductor device, comprising:
  a lower gate electrode disposed on a substrate;
  a plurality of upper gate electrodes disposed on the substrate, wherein the lower gate electrode and the upper gate electrodes are sequentially stacked on the substrate in a direction normal to a top surface of the substrate;
  a through hole penetrating the lower gate electrode, the upper gate electrodes, and a portion of the substrate;
  a lower semiconductor pattern disposed in a lower region of the through hole and partially disposed within the substrate;
  a residue layer comprising at least one of carbon and oxygen disposed in the lower region of the through hole below the lower semiconductor pattern; and
  a void disposed in the lower region of the through hole between the residue layer and the lower semiconductor pattern, wherein an upper boundary of the void is defined by a bottom surface of the lower semiconductor pattern, and a lower boundary of the void is defined by an upper surface of the residue layer.

* * * * *